US008885129B2

(12) United States Patent
Naoe et al.

(10) Patent No.: US 8,885,129 B2
(45) Date of Patent: Nov. 11, 2014

(54) LIQUID CRYSTAL DISPLAY DEVICE AND METHOD OF MANUFACTURING THE SAME

(75) Inventors: Yasuo Naoe, Kanazawa (JP); Kazuyuki Harada, Nonoichi (JP)

(73) Assignee: Japan Display Inc., Tokyo (JP)

( * ) Notice: Subject to any disclaimer, the term of this patent is extended or adjusted under 35 U.S.C. 154(b) by 144 days.

(21) Appl. No.: 13/493,470

(22) Filed: Jun. 11, 2012

(65) Prior Publication Data

US 2012/0314169 A1 Dec. 13, 2012

(30) Foreign Application Priority Data

Jun. 13, 2011 (JP) ................................ 2011-131271

(51) Int. Cl.
*G02F 1/1343* (2006.01)
*G02F 1/1362* (2006.01)
*G02F 1/1333* (2006.01)

(52) U.S. Cl.
CPC .................. *G02F 1/136227* (2013.01); *G02F 2001/134372* (2013.01); *G02F 2001/133357* (2013.01); *G02F 1/133345* (2013.01)
USPC .......................... 349/139; 349/138; 349/187

(58) Field of Classification Search
CPC ... G02F 1/13; G02F 1/1343; G02F 1/134363; G02F 1/134309; G02F 1/134336; G02F 1/136; G02F 1/1362; G02F 1/136227; G02F 1/136286; G02F 1/1333; G02F 1/1368; G02F 1/133514; G02F 1/133707; G02F 1/13439; G02F 1/133512; G02F 1/133723; G02F 1/133711; G02F 1/1337; G02F 2001/13685; G02F 2001/13629; G02F 2002/02; G02F 1/133345; H01L 51/5237; H01L 27/3244; H01L 27/3262; H01L 29/41733; H01L 33/42
USPC .......... 349/141, 43, 138, 139, 106, 123, 143, 349/110, 187; 257/E33.064, E29.273; 345/92
See application file for complete search history.

(56) References Cited

U.S. PATENT DOCUMENTS

| | | | | |
|---|---|---|---|---|
| 7,630,045 | B2 * | 12/2009 | Matsumoto | 349/141 |
| 7,903,219 | B2 * | 3/2011 | Sakurai et al. | 349/138 |
| 2011/0102724 | A1 * | 5/2011 | Ono | 349/143 |
| 2011/0109862 | A1 | 5/2011 | Harada et al. | |
| 2011/0199564 | A1 * | 8/2011 | Moriwaki | 349/122 |

FOREIGN PATENT DOCUMENTS

| | | |
|---|---|---|
| JP | 2000-292801 | 10/2000 |
| JP | 2001-264740 | 9/2001 |
| JP | 2004-302382 | 10/2004 |
| JP | 2007-183585 | 7/2007 |

(Continued)

OTHER PUBLICATIONS

Office Action issued May 7, 2013, in Japanese Patent Application No. 2011-131271 (with English-language translation).

*Primary Examiner* — Thoi Duong
(74) *Attorney, Agent, or Firm* — Oblon, Spivak, McClelland, Maier & Neustadt, L.L.P.

(57) ABSTRACT

According to one embodiment, a liquid crystal display device includes a first substrate including an organic insulation film including a first contact hole penetrating to the switching element, an island-shaped relay electrode and a common electrode which are formed on the organic insulation film, an interlayer insulation film including a second contact hole at a position different from a position of the first contact hole, a pixel electrode which is formed on the interlayer insulation film and includes a slit which is opposed to the common electrode, and an alignment film covering the pixel electrode and the interlayer insulation film.

19 Claims, 6 Drawing Sheets

(56) References Cited

FOREIGN PATENT DOCUMENTS

| | | | |
|---|---|---|---|
| JP | 2008-15345 | | 1/2008 |
| JP | 2010-14975 | | 1/2010 |
| JP | 2010-102220 | | 5/2010 |
| JP | 2010-231773 | | 10/2010 |
| WO | WO 2009/130822 | A1 | 10/2009 |

* cited by examiner

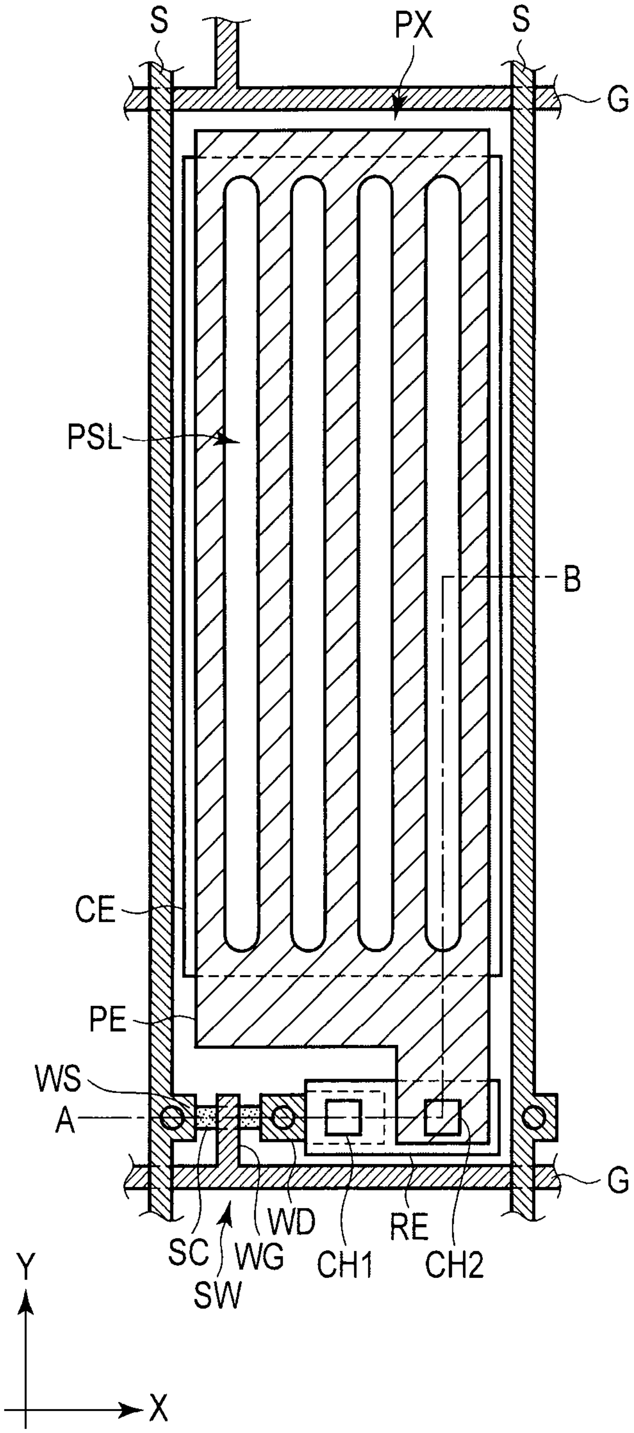
F I G. 3

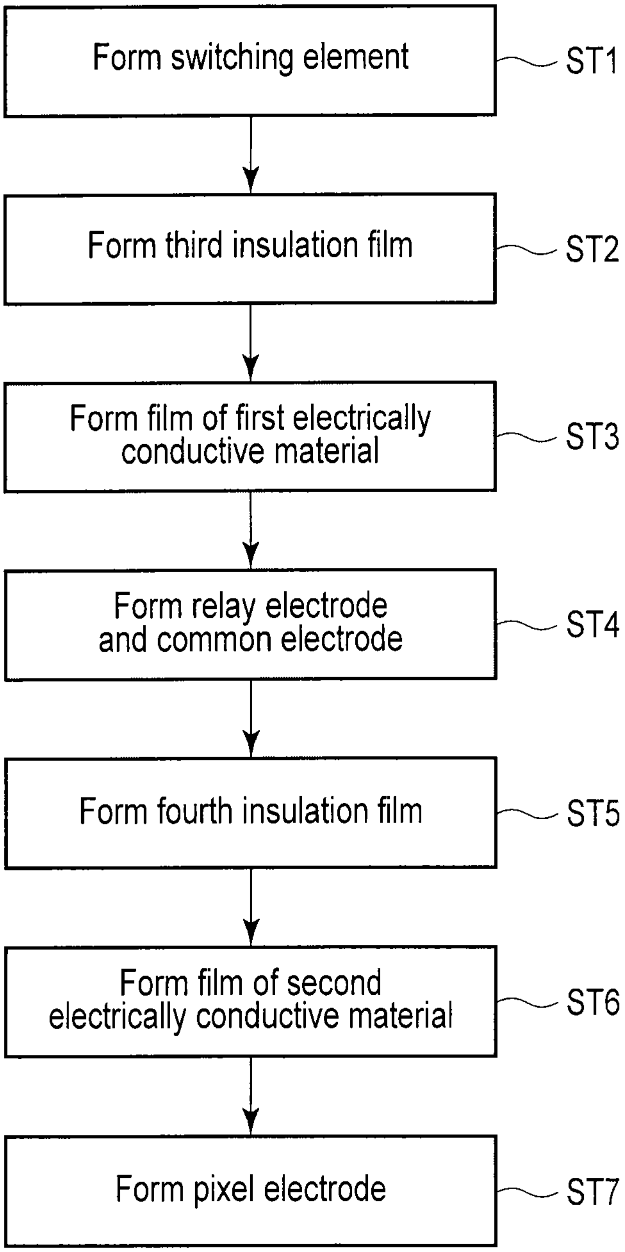
F I G. 6

LIQUID CRYSTAL DISPLAY DEVICE AND METHOD OF MANUFACTURING THE SAME

CROSS-REFERENCE TO RELATED APPLICATIONS

This application is based upon and claims the benefit of priority from prior Japanese Patent Application No. 2011-131271, filed Jun. 13, 2011, the entire contents of which are incorporated herein by reference.

FIELD

Embodiments described herein relate generally to a liquid crystal display device and a method of manufacturing the same.

BACKGROUND

By virtue of such advantageous features as light weight, small thickness and low power consumption, liquid crystal display devices have been used in various fields as display devices of OA equipment, such as personal computers, and TVs. In recent years, liquid crystal display devices have also been used as display devices of portable terminal equipment such as mobile phones, car navigation apparatuses, game machines, etc.

In recent years, liquid crystal display panels of a fringe field switching (FFS) mode have been put to practical use.

BRIEF DESCRIPTION OF THE DRAWINGS

FIG. 3 is a schematic plan view which illustrates a structure of a pixel in an array substrate shown in FIG. 2, as viewed from a counter-substrate side.

FIG. 6 is a flow chart illustrating a part of a fabrication process of the array substrate according to the embodiment.

DETAILED DESCRIPTION

Figure 1:
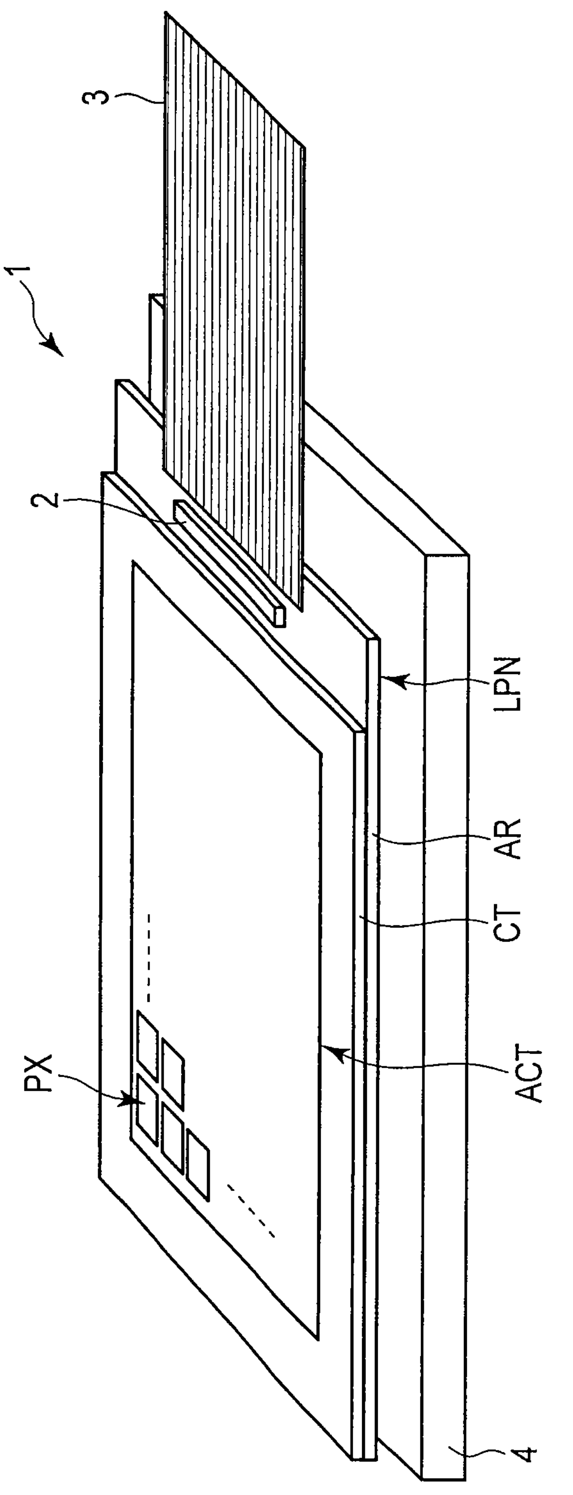
FIG. 1 is a view which schematically illustrates a structure of a liquid crystal display device according to an embodiment.

In general, according to one embodiment, a liquid crystal display device includes: a first substrate including an insulative substrate; a switching element formed above the insulative substrate; an organic insulation film which is disposed above the insulative substrate and the switching element and includes a first contact hole penetrating to the switching element; an island-shaped relay electrode which is formed on the organic insulation film, extends to the first contact hole and is electrically connected to the switching element; a common electrode formed on the organic insulation film and spaced apart from the relay electrode; an interlayer insulation film which is disposed on the relay electrode and the common electrode and includes a second contact hole penetrating to the relay electrode at a position different from a position of the first contact hole; a pixel electrode which is formed on the interlayer insulation film, extends to the second contact hole, is electrically connected to the relay electrode, and includes a slit which is opposed to the common electrode; and an alignment film covering the pixel electrode and the interlayer insulation film; a second substrate which is disposed to be opposed to the first substrate; and a liquid crystal layer including liquid crystal molecules held between the first substrate and the second substrate.

According to another embodiment, a liquid crystal display device includes: a first substrate including an insulative substrate; a switching element formed above the insulative substrate; an organic insulation film which is disposed above the insulative substrate and the switching element, has a first top surface and includes a first contact hole penetrating to the switching element from the first top surface; an island-shaped relay electrode which is formed continuous with the first top surface of the organic insulation film and the first contact hole and is electrically connected to the switching element; a common electrode formed on the first top surface of the organic insulation film and spaced apart from the relay electrode; an interlayer insulation film which is disposed on the relay electrode and the common electrode, has a second top surface and includes a second contact hole penetrating, from the second top surface, to the relay electrode formed on the first top surface; a pixel electrode which is formed on the second top surface of the interlayer insulation film, is stacked on the relay electrode in the second contact hole, and includes a slit which is opposed to the common electrode; and an alignment film covering the pixel electrode and the interlayer insulation film; a second substrate which is disposed to be opposed to the first substrate; and a liquid crystal layer including liquid crystal molecules held between the first substrate and the second substrate.

According to another embodiment, a liquid crystal display device includes: a first substrate including an insulative substrate; an organic insulation film formed above the insulative substrate; a first electrode formed on the organic insulation film; an inorganic insulation film which is disposed on the first electrode and includes a contact hole penetrating to the first electrode; and a second electrode which is formed on the inorganic insulation film and is electrically connected to the first electrode via the contact hole, each of the first electrode and the second electrode having a rougher film structure than the inorganic insulation film.

According to another embodiment, a method of manufacturing a liquid crystal display device in which a liquid crystal layer is held between a first substrate, which includes a pixel electrode and a common electrode, and a second substrate, includes: forming a switching element above an insulative substrate; forming a first contact hole, which penetrates to the switching element, in an organic insulation film which covers the switching element; forming a film of a first electrically conductive material on the organic insulation film and in the first contact hole; patterning the first electrically conductive material, to form an island-shaped relay electrode which is electrically connected to the switching element in the first contact hole, and a common electrode which is spaced apart from the relay electrode; forming a second contact hole, which penetrates to the relay electrode, in an interlayer insulation film, which covers the relay electrode and the common electrode, at a position different from a position of the first contact hole; forming a film of a second electrically conductive material on the interlayer insulation film and in the second contact hole; and patterning the second electrically conductive material, to form a pixel electrode which is electrically connected to the relay electrode in the second contact hole and includes a slit which is opposed to the common electrode.

Embodiments will now be described in detail with reference to the accompanying drawings. In the drawings, structural elements having the same or similar functions are denoted by like reference numerals, and an overlapping description is omitted.

FIG. 1 is a view which schematically illustrates a structure of a liquid crystal display device according to an embodiment.

Specifically, the liquid crystal display device 1 includes an active-matrix-type liquid crystal display panel LPN, and a backlight 4 which illuminates the liquid crystal display panel LPN. In the example illustrated, the liquid crystal display device 1 includes, as signal sources that are necessary for driving the liquid crystal display panel LPN, a driving IC chip 2 and a flexible wiring board 3.

The liquid crystal display panel LPN is configured to include an array substrate (first substrate) AR, a counter-substrate (second substrate) CT which is disposed to be opposed to the array substrate AR, and a liquid crystal layer (not shown) which is held between the array substrate AR and the counter-substrate CT. The liquid crystal display panel LPN includes an active area (screen part) ACT which displays an image. The active area ACT is composed of a plurality of pixels PX which are arrayed in a matrix of m×n (m and n are positive integers).

The backlight 4 is disposed on the back side of the array substrate AR. Various modes are applicable to the backlight 4. As the backlight 4, use may be made of either a backlight including a light-emitting diode (LED) as a light source, or a backlight including a cold cathode fluorescent lamp (CCFL) as a light source. A description of the detailed structure of the backlight 4 is omitted.

Figure 2:
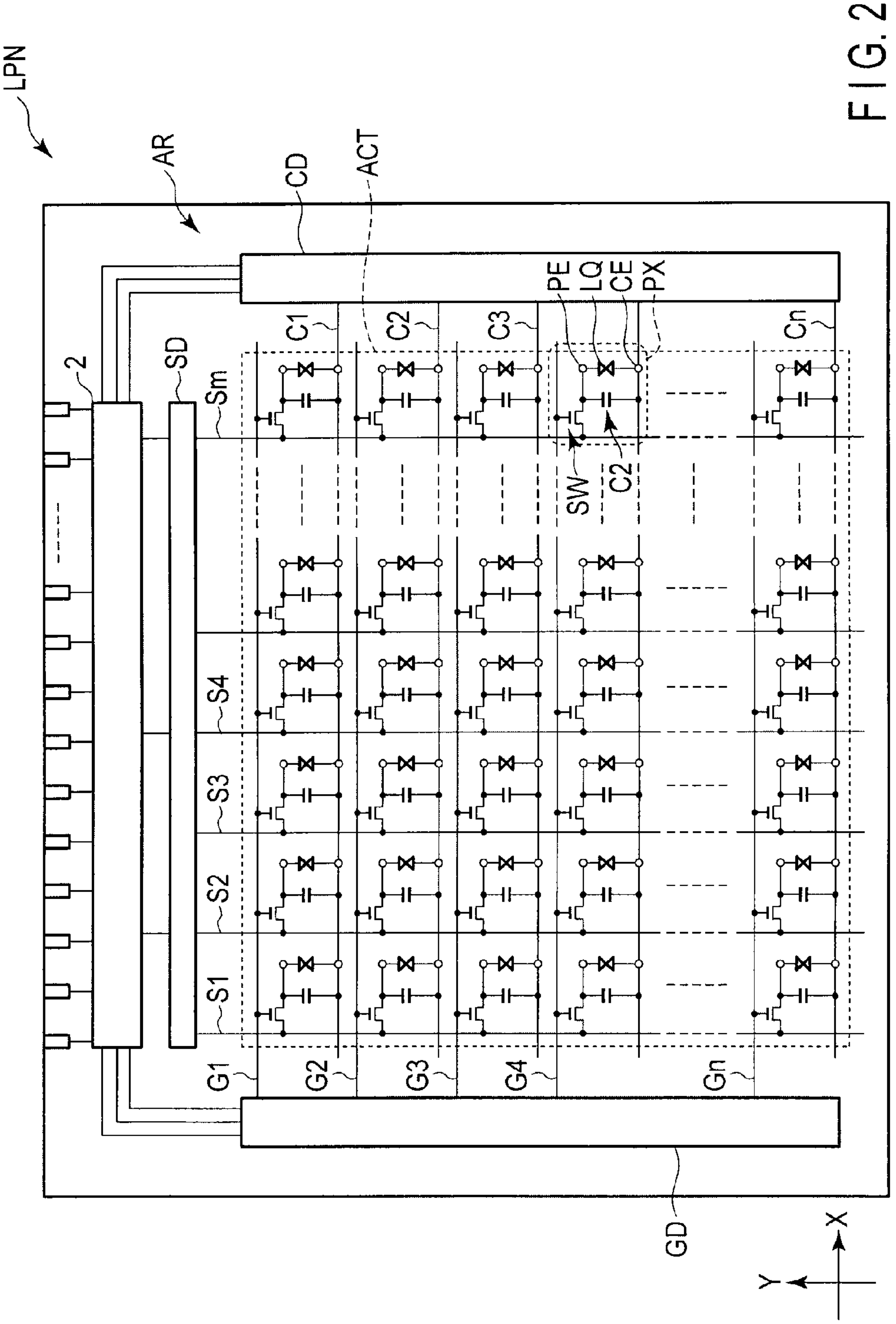
FIG. 2 is a view which schematically illustrates a structure and an equivalent circuit of a liquid crystal display panel shown in FIG. 1.

FIG. 2 is a view which schematically shows a structure and an equivalent circuit of the liquid crystal display panel LPN shown in FIG. 1.

The array substrate AR includes, in the active area ACT, an n-number of gate lines G (G1 to Gn), an n-number of capacitance lines C (C1 to Cn), an m-number of source lines S (S1 to Sm), an (m×n) number of switching elements SW, each of which is electrically connected to the gate line G and source line S in each pixel PX, an (m×n) number of pixel electrodes PE, each of which is electrically connected to the switching element SW in each pixel PX, and a common electrode CE which is a part of the capacitance line C and is opposed to the pixel electrode PE. A storage capacitance CS is formed between the capacitance line C and pixel electrode PE.

Each of the gate lines G is led out of the active area ACT and is connected to a first driving circuit GD. Each of the source lines S is led out of the active area ACT and is connected to a second driving circuit SD. Each of the capacitance lines C is led out of the active area ACT and is connected to a third driving circuit CD. The first driving circuit GD, second driving circuit SD and third driving circuit CD are formed on the array substrate AR and are connected to the driving IC chip 2. In the example illustrated, the driving IC chip 2 is mounted on the array substrate AR, on the outside of the active area ACT of the liquid crystal display panel LPN.

In addition, the liquid crystal display panel LPN of the illustrated example includes the pixel electrode PE and common electrode CE on the array substrate AR, and a fringe field switching (FFS) mode is applied to the liquid crystal display panel LPN. In the FFS mode, liquid crystal molecules, which constitute the liquid crystal layer LQ, are switched by mainly using a lateral electric field which is produced between the pixel electrode PE and common electrode CE (in particular, that part of a fringe electric field, which is substantially parallel to a major surface of the substrate).

FIG. 3 is a schematic plan view which illustrates the structure of the pixel PX in the array substrate AR shown in FIG. 2, as viewed from the counter-substrate CT side. This plan view shows an example of the pixel layout, and the embodiment is not limited to this pixel layout.

The gate lines G extend in a first direction X. The source lines S extend in a second direction Y which crosses the first direction X. The first direction X is perpendicular to the second direction Y. The switching element SW is disposed near an intersection between the gate line G and the source line S, and is composed of, for example, a thin-film transistor (TFT). The switching element SW includes, for example, a polysilicon semiconductor layer SC as a semiconductor layer.

A gate electrode WG of the switching element SW is located above the polysilicon semiconductor layer SC, and is electrically connected to the gate line G (in the example illustrated, the gate electrode WG is formed integral with the gate line G). A source electrode WS of the switching element SW is electrically connected to the source line S (in the example illustrated, the source electrode WS is formed integral with the source line S).

A relay electrode RE is formed in an island shape. In an X-Y plane, the relay electrode RE extends to a position overlapping a drain electrode WD. The relay electrode RE is electrically connected to the drain electrode WD of the switching element SW via a first contact hole CH1.

The common electrode CE is formed, for example, in a substantially rectangular shape. In the X-Y plane, the common electrode CE is spaced apart from the relay electrode RE. In addition, this common electrode CE is electrically connected to the capacitance line (not shown) and is set at a common potential.

The pixel electrode PE is formed, for example, in a substantially rectangular shape. In the X-Y plane, the pixel electrode PE is disposed above the common electrode CE. In addition, a plurality of slits PSL, which are opposed to the common electrode CE, are formed in the pixel electrode PE. In the X-Y plane, the pixel electrode PE extends to a position overlapping the relay electrode RE. The pixel electrode PE is electrically connected to the relay electrode RE via a second contact hole CH2 which is formed at a position different from the position of the first contact hole CH1. Thereby, the pixel electrode PE is electrically connected to the switching element SW.

Figure 4:
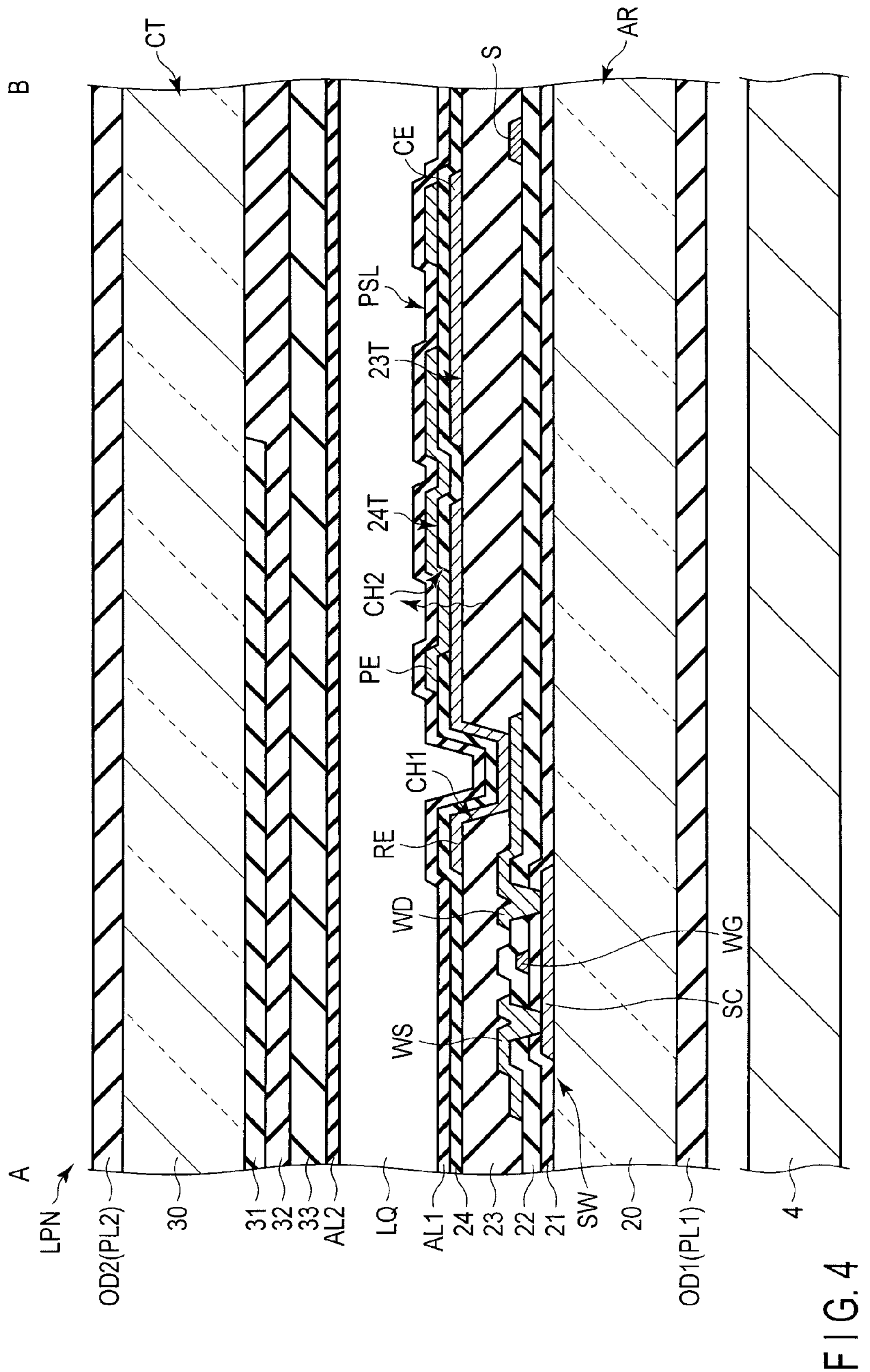
FIG. 4 is a cross-sectional view which schematically shows a cross-sectional structure of the liquid crystal display panel, in a case where the pixel shown in FIG. 3 is cut along line A-B.

FIG. 4 is a cross-sectional view which schematically shows a cross-sectional structure of the liquid crystal display panel LPN, in a case where the pixel PX shown in FIG. 3 is cut along line A-B.

Specifically, the array substrate AR is formed by using a first insulative substrate 20 with light transmissivity, such as a glass substrate. The array substrate AR includes the switching element SW on an inner surface of the first insulative substrate 20 (i.e. that surface of the first insulative substrate 20, which is opposed to the counter-substrate CT). The switching element SW illustrated in this example is a top-gate type thin-film transistor. The polysilicon semiconductor layer SC is formed above the first insulative substrate 20. The polysilicon semiconductor layer SC is covered with a first insulation film 21. In addition, the first insulation film 21 is also disposed above the first insulative substrate 20.

The gate electrode WG of the switching element SW is formed on the first insulation film 21, and is located above the polysilicon semiconductor layer SC. The gate electrode WG is covered with a second insulation film 22. In addition, the second insulation film 22 is also disposed on the first insulation film 21.

The source electrode WS and drain electrode WD of the switching element SW are formed on the second insulation film 22. The source electrode WS and drain electrode WD are put in contact with the polysilicon semiconductor layer SC via contact holes which penetrate the first insulation film 21 and second insulation film 22. The source electrode WS and drain electrode WD are covered with a third insulation film 23. In addition, the third insulation film 23 is also disposed on the second insulation film 22.

The third insulation film 23 corresponds to an organic insulation film which is disposed above the switching element SW, and is formed of a transparent organic material. In addition, the third insulation film 23 has a substantially planar top surface 23T and the first contact hole CH1 which penetrates, from the top surface 23T, to the drain electrode WD of the switching element SW.

The relay electrode RE is formed on the top surface 23T of the third insulation film 23. In addition, the relay substrate RE is also formed in the first contact hole CH1. Specifically, the relay electrode RE, which is formed on the top surface 23T, extends to the first contact hole CH1 and comes in contact with the drain electrode WD of the switching element SW. In other words, the relay electrode RE is formed continuous with the top surface 23T and the first contact hole CH1. Thereby, the relay electrode RE is electrically connected to the switching element SW.

The common electrode CE is formed on the top surface 23T of the third insulation film 23 and is spaced apart from the relay electrode RE.

The relay electrode RE and common electrode CE are covered with a fourth insulation film 24. In addition, the fourth insulation film 24 is also disposed on the third insulation film 23. The fourth insulation film 24 corresponds to an interlayer insulation film which is disposed on the relay electrode RE and common electrode CE, and is formed of an inorganic material including silicon (Si), such as silicon oxide (SiO). Specifically, the fourth insulation film 24, which covers the relay electrode RE, covers the entirety of the relay electrode RE at a position overlapping the first contact hole CH1. Thus, the fourth insulation film 24 includes no contact hole at a position overlapping the first contact hole CH1.

The fourth insulation film 24 has a top surface 24T and the second contact hole CH2 which penetrates from the top surface 24T to the relay electrode RE. The second contact hole CH2 penetrates to the relay electrode RE at a position different from a position immediately above the first contact hole CH1. Specifically, the second contact hole CH2 penetrates from the top surface 24T to the relay electrode RE which is formed on the top surface 23T of the third insulation film 23.

The pixel electrode PE is formed on the top surface 24T of the fourth insulation film 24. In addition, the pixel electrode PE is also formed in the second contact hole CH2 and is stacked on the relay electrode RE in the second contact hole CH2. Specifically, the pixel electrode PE, which is formed on the top surface 24T, extends to the second contact hole CH2 and comes in contact with the relay electrode RE. In other words, the pixel electrode PE is formed continuous with the top surface 24T and the second contact hole CH2. Thereby, the pixel electrode PE is electrically connected to the relay electrode RE. In addition, the pixel electrode PE includes the slit PSL. The slit PSL is formed immediately above the common electrode CE.

The relay electrode RE, common electrode CE and pixel electrodes PE are formed of a transparent, electrically conductive material such as indium tin oxide (ITO) or indium zinc oxide (IZO). The pixel electrode PE is covered with a first alignment film AL1. In addition, the first alignment film AL1 also covers the fourth insulation film 24. The first alignment film AL1 is disposed on that surface of the array substrate AR, which is in contact with the liquid crystal layer LQ.

In the meantime, the gate line G, which is integral with the gate electrode WG, is formed on the first insulation film 21, and is covered with the second insulation film 22. In addition, the source line S, which is integral with the source electrode WS, is formed on the second insulation film 22, and is covered with the third insulation film 23.

In the array substrate AR having the above-described structure, the relay electrode RE is stacked on the exposed drain electrode WD in the first contact hole CH1, and this relay electrode RE is covered with the fourth insulation film 24. Specifically, in the first contact hole CH1, the relay electrode RE, fourth insulation film 24 and first alignment film AL1 are stacked in the named order, and the pixel electrode PE is absent. In addition, in the second contact hole CH2, the pixel electrode PE is stacked on the exposed relay electrode RE. Specifically, in the second contact hole CH2, the pixel electrode PE and first alignment film AL1 are stacked in the named order.

On the other hand, the counter-substrate CT is formed by using a second insulative substrate 30 with light transmissivity, such as a glass substrate. The counter-substrate CT includes a black matrix 31 which partitions pixels PX, a color filter 32 and an overcoat layer 33 on an inner surface of the second insulative substrate 30 (i.e. that surface of the second insulative substrate 30, which is opposed to the array substrate AR).

The black matrix 31 is formed on the inner surface of the second insulative substrate 30 so as to be opposed to wiring portions, such as gate lines G, source lines G and switching elements SW, which are provided on the array substrate AR. The color filter 32 is formed on the inner surface of the second insulative substrate 30, and is formed of resin materials which are colored in mutually different colors, e.g. three primary colors of red, blue and green. The resin material colored in red is disposed in association with a red pixel. Similarly, the resin material colored in blue is disposed in association with a blue pixel, and the resin material colored in green is disposed in association with a green pixel.

The overcoat layer 33 is formed on the black matrix 31 and color filter 32. The overcoat layer 33 planarizes asperities on the surface of the black matrix 31 and color filter 32. The overcoat layer 33 is covered with a second alignment film AL2. The second alignment film AL2 is disposed on that surface of the counter-substrate CT, which is in contact with the liquid crystal layer LQ.

The above-described array substrate AR and counter-substrate CT are disposed such that their first alignment film AL1 and second alignment film AL2 are opposed to each other. In this case, spacers (not shown) (e.g. columnar spacers which are formed of a resin material so as to be integral with one of the substrates) are disposed between the array substrate AR and the counter-substrate CT. Thereby, a predetermined cell gap is created. The array substrate AR and counter-substrate CT are attached by a sealant in the state in which the predetermined cell gap is created therebetween. The liquid crystal layer LQ is composed of a liquid crystal composition including liquid crystal molecules which are sealed in the gap created between the first alignment film AL1 of the array substrate AR and the second alignment film AL2 of the counter-substrate CT.

The backlight BL is disposed on the back side of the liquid crystal display panel LPN having the above-described structure. A first optical element OD1 including a first polarizer PL1 is disposed on one of the outer surfaces of the liquid crystal display panel LPN, that is, an outer surface of the first insulative substrate 20 which constitutes the array substrate AR. In addition, a second optical element OD2 including a second polarizer PL2 is disposed on the other outer surface of the liquid crystal display panel LPN, that is, an outer surface of the second insulative substrate 30 which constitutes the counter-substrate CT.

The first alignment film AL1 and second alignment film AL2 are subjected to alignment treatment in the same direction in the X-Y plane. Accordingly, in the state in which no electric field is produced between the pixel electrode PE and common electrode CE, the liquid crystal molecules included in the liquid crystal layer LQ are initially aligned in the alignment treatment direction of the first alignment film AL1 and second alignment film AL2 in the X-Y plane. In the state in which a fringe electric field is produced between the pixel electrode PE and common electrode CE, the liquid crystal molecules are aligned in a direction different from the initial alignment direction in the X-Y plane.

Next, referring to FIG. 6, a brief description is given of a method of manufacturing the liquid crystal display device having the above-described structure.

To start with, films of a semiconductor material, an electrically conductive material and an insulation film material are formed on the first insulative substrate 20 for fabricating the array substrate AR, and these films are patterned in desired shapes. Thereby, a first insulation film 21, a second insulation film 22, a gate line G, a source line S and a switching element SW are formed (ST1).

Then, using a transparent organic material, a third insulation film 23, which covers the switching element SW, etc., is formed. At this time, a first contact hole CH1, which penetrates to the switching element SW, is formed in the third insulation film 23 (ST2).

Thereafter, a film of a first conductive material (e.g. ITO) is formed on the third insulation film 23 (ST3).

Then, by patterning the first conductive material, an island-shaped relay electrode RE which is electrically connected to the switching element SW via the first contact hole CH1, and a common electrode CE which is spaced apart from the relay electrode RE, are formed (ST4).

Subsequently, using a transparent inorganic material (e.g. SiO), a fourth insulation film 24, which covers the relay electrode RE and common electrode CE, is formed. At this time, a second contact hole CH2, which penetrates to the relay electrode RE, is formed in the fourth insulation film 24 at a position different from a position immediately above the first contact hole CH1 (ST5).

Thereafter, a film of a second conductive material (e.g. ITO) is formed on the fourth insulation film 24 (ST6). By patterning the second conductive material, a pixel electrode PE, which is electrically connected to the relay electrode RE via the second contact hole CH2 and includes a slit that is opposed to the common electrode CE, is formed (ST7).

The surface of the array substrate AR, which has thus been fabricated, is covered with a first alignment film AL1, and the resultant structure is subjected to alignment treatment such as rubbing treatment or optical alignment treatment.

On the other hand, a counter-substrate CT is prepared, and the array substrate AR and counter-substrate CT are attached by using a sealant. A liquid crystal layer LQ may be sealed in by dispensing a proper amount of liquid crystal before the array substrate AR and counter-substrate CT are attached. Alternatively, after the array substrate AR and counter-substrate CT are attached, the liquid crystal layer LQ may be injected from a liquid crystal injection hole which is formed by the sealant, and then sealed.

Thereafter, a first optical element OD1 is attached to the outer surface of the array substrate AR, a second optical element OD2 is attached to the outer surface of the counter-substrate CT, and a signal source is mounted on the liquid crystal display panel LPN.

The liquid crystal display device is manufactured through the above-described fabrication steps.

In the above-described manufacturing process, the third insulation film 23 that is formed of the organic material tends to easily absorb moisture in a washing step after the formation of the third insulation film 23 or in a wet step at a time of patterning. Besides, the third insulation film 23 may absorb moisture in the air.

In the embodiment, the third insulation film 23 is covered with the relay electrode RE, common electrode CE and fourth insulation film 24. The material which forms the fourth insulation film 24 forms a relatively dense film, while the material which forms the relay electrode RE and common electrode CE forms a rougher film than the material which forms the fourth insulation film 24. In addition, the material which forms the pixel electrode PE, which is stacked on the relay electrode RE in the second contact hole CH2, forms a rougher film, like the material which forms the relay electrode RE and common electrode CE.

In some cases, moisture absorbed in the third insulation film 23 is evaporated through a high-temperature process and is released to the outside. When the third insulation film 23 is introduced in the high-temperature process after the third insulation film 23 is covered with the relay electrode RE, common electrode CE and fourth insulation film 24, the vapor, which is released from the third insulation film 23, hardly passes through the dense fourth insulation film 24 having a high film density, while the vapor permeates into the parts having a lower film density than the fourth insulation film 24, namely the relay electrode PE and common electrode CE which have a rougher film structure than the fourth insulation film 24.

However, since the common electrode CE is covered with the fourth insulation film 24, substantially no passage for discharging vapor, which has entered the common electrode CE, is formed in the common electrode CE. As regards the relay electrode RE, the relay electrode RE is covered with the fourth insulation film 24, but the relay electrode RE is exposed from the fourth insulation film 24 in the second contact hole CH2, and the pixel electrode PE is stacked on the exposed relay electrode RE. Specifically, in the second contact hole CH2, the relay electrode RE and pixel electrode PE are stacked upward from the top surface 23T of the third insulation film 23, and this stacked body is exposed from the dense fourth insulation film 24. Thus, the stacked body of the relay electrode RE and pixel electrode PE forms a vapor release passage. Specifically, the vapor, which has entered the relay electrode RE from the third insulation film 23, is released to the outside via the pixel electrode PE in the second contact hole CH2.

The film thickness of the relay electrode RE is about 30 to 70 nm, and the film thickness of the pixel electrode PE is about 30 to 70 nm. Accordingly, the thickness of the stacked body of the relay electrode RE and pixel electrode PE is about 60 to 140 nm. In addition, the thickness of the third insulation film 23 is about 2 μm to 5 μm, and the thickness of the fourth insulation film 24 is about 200 nm to 300 nm. Accordingly, the thickness of the stacked body of the relay electrode RE and pixel electrode PE is substantially equal to the thickness of the fourth insulation film 24. As described above, the stacked electrode is provided on the third insulation film 23 that is formed of the organic material, and the fourth insulation film 24 that is formed of the inorganic material stacked on this electrode is configured such that the second contact hole CH2 is provided on the electrode having a lower film density than the fourth insulation film 24. Thereby, the moisture in the third insulation film 23 is released to the outside via the second contact hole CH2.

In addition, since such second contact holes CH2 are formed in the respective pixels PX, the second contact holes CH2 are uniformly distributed over the entirety of the active area ACT. Thus, moisture in the third insulation film 23 can be released from the second contact holes CH2 over almost the entirety of the active area ACT.

Therefore, it is possible to suppress degradation in adhesion between the third insulation film 23 and the fourth insulation film 24, or lifting of the fourth insulation film 24 due to release of vapor, or occurrence of peeling. Thereby, the occurrence of a defective panel due to lifting or peeling of the fourth insulation film 24 can be suppressed, and a decrease in manufacturing yield can be suppressed.

In the meantime, the release of vapor from the third insulation film 23 occurs in a high-temperature process, such as baking, in the manufacturing process of the array substrate AR, and the release of vapor substantially ends before the array substrate AR is attached to the counter-substrate CT. Thus, a problem due to release of vapor (e.g. a problem such as generation of bubbles in the liquid crystal layer LQ) hardly occurs after the array substrate AR and counter-substrate CT are attached.

Next, a comparative example is described.

Figure 5:
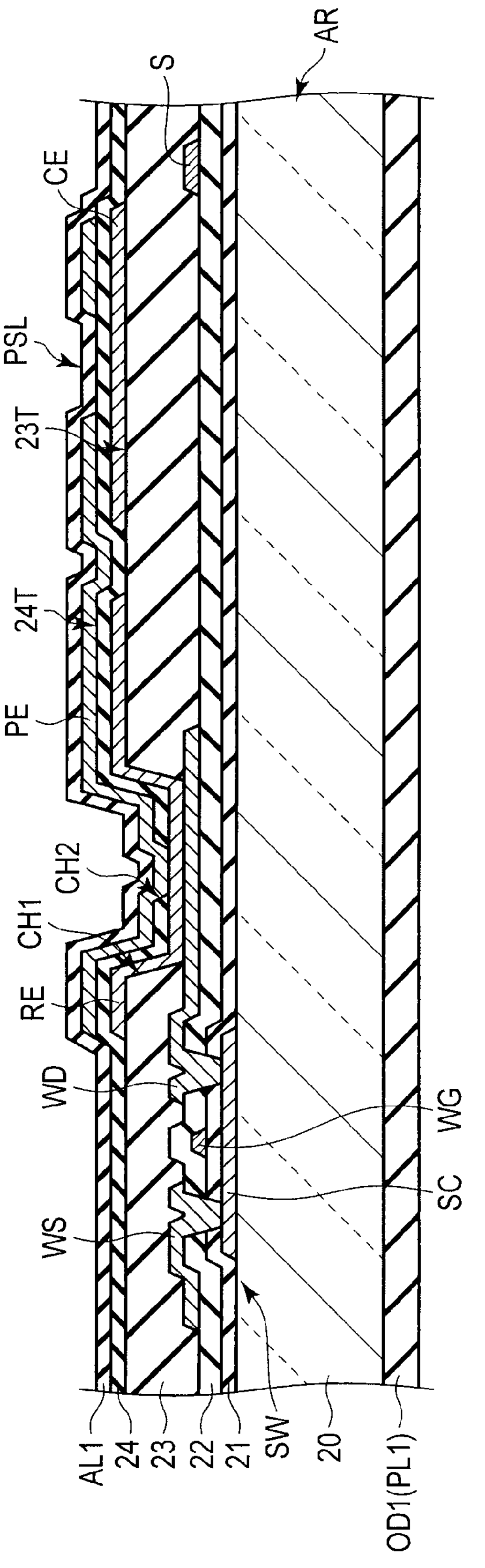
FIG. 5 is a cross-sectional view which schematically shows a cross-sectional structure of an array substrate according to a comparative example.

FIG. 5 is a cross-sectional view which schematically shows a cross-sectional structure of an array substrate AR according to the comparative example.

In the comparative example, a second contact hole CH2 of the fourth insulation film 24 is formed at a position immediately above the first contact hole CH1. Specifically, in the first contact hole CH1, a relay electrode RE is stacked on the exposed drain electrode WD, and the relay electrode RE is covered with the fourth insulation film 24. The fourth insulation film 24 has the second contact hole CH2 which exposes the relay electrode RE in the first contact hole CH1. In the second contact hole CH2, the pixel electrode PE is stacked on the exposed relay electrode RE. In this manner, the stacked body of the relay electrode RE and the pixel electrode PE is formed inside the first contact hole CH1, and is not formed on the top surface 23T of the third insulation film 23.

The relay electrode RE and pixel electrode PE, which cover the top surface 23T of the third insulation film 23, are further covered with the fourth insulation film 24, and the relay electrode RE that is formed in the first contact hole CH1 is covered, up to its substantially central part, with the fourth insulation film 24.

In this comparative example, there is substantially no passage for releasing moisture, which is absorbed in the third insulation film 23, to the outside. Specifically, since the common electrode CE is covered with the fourth insulation film 24, there is substantially no passage for releasing vapor which has entered the common electrode CE. In addition, since the relay electrode RE, which is formed on the top surface 23T of the third insulation film 23, is covered with the fourth insulation film 24, there is substantially no passage for releasing vapor which has entered the relay electrode RE. In the meantime, the relay electrode RE, which is formed in the first contact hole CH1, is exposed from the fourth insulation film 24 in the second contact hole CH2.

However, the position of the stacked body of the relay electrode RE and pixel electrode PE, which is formed in the second contact hole CH2, is spaced apart from the third insulation film 23. In addition, a horizontal path length in the relay electrode RE, which reaches the stacked body of the relay electrode RE and pixel electrode PE from the third insulation film 23, is much longer than a path length in the thickness direction of the stacked body as in the embodiment. Thus, the horizontal path in the relay electrode RE hardly functions as a vapor release passage.

Hence, there is little vapor release passage from the third insulation film 23, and vapor stays between the third insulation film 23 and the fourth insulation film 24 overlapping the third insulation film 23, between the relay electrode RE and fourth insulation film 24, or between the common electrode CE and the fourth insulation film 24, and bubbles or lifting of the fourth insulation film 24 occurs. Consequently, there is concern that the yield decreases.

As described above, moisture of the third insulation film 23 tends to be confined in the structure in which the relay electrode RE and common electrode CE are formed on the third insulation film 23 which is formed of the organic material that tends to absorb moisture, the relay electrode RE and common electrode CE are covered with the fourth insulation film 24 that is formed of a relatively dense inorganic material, and this fourth insulation film 24 serves as an interlayer insulation film between the pixel electrode PE and the common electrode CE. Therefore, it is very effective to form a release passage for releasing moisture from the third insulation film 23 to the outside. In the present embodiment, the stacked body of the relay electrode RE and pixel electrode PE, which are relatively rough films, is formed on the top surface 23T of the third insulation film 23, and a release passage for releasing moisture from the third insulation film 23 is formed. Thereby, lifting of the fourth insulation film 24 can be suppressed.

The present embodiment is not limited to the above-described examples. For example, a first substrate includes an insulative substrate, an organic insulation film which is formed on the insulative substrate, a first electrode which is formed on the organic insulation film, an inorganic insulation film which is disposed on the first electrode and includes a contact hole penetrating to the first electrode, and a second electrode which is formed on the inorganic insulation film and is electrically connected to the first electrode via the contact hole. When the first electrode and second electrode of the first insulative substrate have a rougher film structure than the inorganic insulation film, for example, when the first electrode and second electrode are transparent electrodes of, e.g. ITO or IZO, moisture in the organic insulation film is released through the contact hole which connects the transparent electrodes. Therefore, not only in the structure of the pixel part, but also in the peripheral part of the active area, the same advantageous effects as described above can be obtained in the case of the structure wherein the first transparent electrode, inorganic insulation film and second transparent electrode are successively stacked in the named order on the organic insulation film, and the first transparent electrode and second transparent electrode are connected via the contact hole of the inorganic insulation film.

As has been described above, according to the present embodiment, there can be provided a liquid crystal display device which can suppress a decrease in manufacturing yield and a method of manufacturing the liquid crystal display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal display device comprising:

a first substrate including an insulative substrate; a switching element formed above the insulative substrate; an organic insulation film which is disposed above the insulative substrate and the switching element and includes a first contact hole penetrating to the switching element; an island-shaped relay electrode which is formed on the organic insulation film, extends to the first contact hole and is electrically connected to the switching element; a common electrode formed on the organic insulation film and spaced apart from the relay electrode; an interlayer insulation film which is disposed on the relay electrode and the common electrode and includes a second contact hole penetrating to the relay electrode at a position different from a position of the first contact hole; a pixel electrode which is formed on the interlayer insulation film, extends to the second contact hole, is electrically connected to the relay electrode, and includes a slit which is opposed to the common electrode; and an alignment film covering the pixel electrode and the interlayer insulation film;

a second substrate which is disposed to be opposed to the first substrate; and a liquid crystal layer including liquid crystal molecules held between the first substrate and the second substrate.

2. The liquid crystal display device of claim 1, wherein the relay electrode, the interlayer insulation film and the alignment film are stacked in the named order in the first contact hole.

3. The liquid crystal display device of claim 2, wherein the organic insulation film is formed of a transparent organic material.

4. The liquid crystal display device of claim 3, wherein the relay electrode, the common electrode and the pixel electrode are formed of a transparent, electrically conductive material.

5. The liquid crystal display device of claim 4, wherein the interlayer insulation film is formed of an inorganic material including silicon (Si).

6. The liquid crystal display device of claim 5, wherein each of the relay electrode, the common electrode and the pixel electrode has a rougher film structure than the interlayer insulation film.

7. The liquid crystal display device of claim 6, wherein the switching element includes a polysilicon semiconductor layer.

8. A liquid crystal display device comprising:

a first substrate including an insulative substrate; a switching element formed above the insulative substrate; an organic insulation film which is disposed above the insulative substrate and the switching element, has a first top surface and includes a first contact hole penetrating to the switching element from the first top surface; an island-shaped relay electrode which is formed continuous with the first top surface of the organic insulation film and the first contact hole and is electrically connected to the switching element; a common electrode formed on the first top surface of the organic insulation film and spaced apart from the relay electrode; an interlayer insulation film which is disposed on the relay electrode and the common electrode, has a second top surface and includes a second contact hole penetrating, from the second top surface, to the relay electrode formed on the first top surface at a position different from a position of the first contact hole; a pixel electrode which is formed on the second top surface of the interlayer insulation film, is stacked on the relay electrode in the second contact hole, and includes a slit which is opposed to the common electrode; and an alignment film covering the pixel electrode and the interlayer insulation film;

a second substrate which is disposed to be opposed to the first substrate; and a liquid crystal layer including liquid crystal molecules held between the first substrate and the second substrate.

9. The liquid crystal display device of claim 8, wherein the relay electrode, the interlayer insulation film and the alignment film are stacked in the named order in the first contact hole.

10. The liquid crystal display device of claim 9, wherein the organic insulation film is formed of a transparent organic material.

11. The liquid crystal display device of claim 10, wherein the relay electrode, the common electrode and the pixel electrode are formed of a transparent, electrically conductive material.

12. The liquid crystal display device of claim 11, wherein the interlayer insulation film is formed of an inorganic material including silicon (Si).

13. The liquid crystal display device of claim 12, wherein each of the relay electrode, the common electrode and the pixel electrode has a rougher film structure than the interlayer insulation film.

14. The liquid crystal display device of claim 13, wherein the switching element includes a polysilicon semiconductor layer.

15. A method of manufacturing a liquid crystal display device in which a liquid crystal layer is held between a first substrate, which includes a pixel electrode and a common electrode, and a second substrate, comprising:

forming a switching element above an insulative substrate;

forming a first contact hole, which penetrates to the switching element, in an organic insulation film which covers the switching element;

forming a film of a first electrically conductive material on the organic insulation film and in the first contact hole;

patterning the first electrically conductive material, to form an island-shaped relay electrode which is electrically connected to the switching element in the first contact hole, and a common electrode which is spaced apart from the relay electrode;

forming a second contact hole, which penetrates to the relay electrode, in an interlayer insulation film, which covers the relay electrode and the common electrode, at a position different from a position of the first contact hole;

forming a film of a second electrically conductive material on the interlayer insulation film and in the second contact hole; and patterning the second electrically conductive material, to form a pixel electrode which is electrically connected to the relay electrode in the second contact hole and includes a slit which is opposed to the common electrode.

16. The method of claim 15, wherein the first electrically conductive material and the second electrically conductive material are transparent.

17. The method of claim 16, wherein the organic insulation film is formed of a transparent organic material.

18. The method of claim 17, wherein the interlayer insulation film is formed of an inorganic material including silicon (Si).

19. The method of claim 18, wherein each of the relay electrode, the common electrode and the pixel electrode has a rougher film structure than the interlayer insulation film.

* * * * *